United States Patent [19]
Chartrand et al.

[11] Patent Number: 5,890,284
[45] Date of Patent: Apr. 6, 1999

[54] METHOD FOR MODIFYING CIRCUIT HAVING BALL GRID ARRAY INTERCONNECTIONS

[75] Inventors: Richard L. Chartrand, Hyde Park; Wai-Mon Ma, Poughkeepsie; Roger A. Stinemire, Kingston, all of N.Y.

[73] Assignee: International Business Machines Corporation, Armonk, N.Y.

[21] Appl. No.: 978,110

[22] Filed: Nov. 25, 1997

Related U.S. Application Data

[62] Division of Ser. No. 691,282, Aug. 1, 1996.

[51] Int. Cl.$^6$ .............................. H05K 3/34; H05K 3/40
[52] U.S. Cl. ................... 29/853; 29/402.07; 29/402.08; 29/837; 29/840; 29/841; 29/843; 29/847; 29/850; 174/263; 174/267; 228/180.1; 228/264; 361/774; 439/83
[58] Field of Search .......................... 29/402.06, 402.07, 29/402.08, 593, 834, 837, 840, 841, 843, 846, 847, 850, 852, 853; 174/254, 261, 263, 266, 267; 228/264, 180.1; 361/764, 767, 774; 439/46, 75, 83, 84

[56] References Cited

U.S. PATENT DOCUMENTS

| | | | |
|---|---|---|---|
| 3,859,711 | 1/1975 | Mckiddy | 29/593 |
| 4,017,968 | 4/1977 | Weglin | 29/853 |
| 4,170,819 | 10/1979 | Peter et al. | 29/853 |
| 4,183,137 | 1/1980 | Lomerson | 29/853 |
| 4,371,744 | 2/1983 | Badet et al. | 174/254 |
| 4,602,733 | 7/1986 | Slack et al. | 228/264 X |
| 4,799,128 | 1/1989 | Chen | 174/266 X |
| 5,290,970 | 3/1994 | Currie | 174/266 X |
| 5,342,999 | 8/1994 | Frei et al. | 174/266 |
| 5,407,864 | 4/1995 | Kim | 29/852 X |
| 5,473,813 | 12/1995 | Chobot et al. | 29/837 |
| 5,568,682 | 10/1996 | Gater, Jr. et al. | 29/852 X |

FOREIGN PATENT DOCUMENTS

| | | | |
|---|---|---|---|
| 2551618 | 3/1985 | France | 29/852 |
| 143345 | 8/1980 | Germany | 29/853 |
| 4250695 | 9/1992 | Japan | 29/852 |

OTHER PUBLICATIONS

IBM Technical Disclosure Bulletin, vol. 20, No. 11B, Apr. 1978 "Engineering Change Technique Using Off–Set Holes for Printed–Circuit Boards".
IBM Technical Disclosure Bulletin, vol. 22, No. 1, Jun. 1979, "Defective Hole Repair".
IBM Technical Disclosure Bulletin, vol. 23, No. 9, Feb. 1981, "Defective Hole Repair/Hermetic Seal".
IBM Technical Disclosure Bulletin, vol. 25, No. 12, May 1983, "Insert Expansion Fit Fastner".
IBM Technical Disclosure Bulletin, vol. 33, No. 1B, Jun. 1990, "Printed Circuit Net Repair Utilizing a Coaxial Cable–to–Board Pin Connection".

*Primary Examiner*—Peter Vo
*Attorney, Agent, or Firm*—DeLio & Peterson, LLC; Peter W. Peterson; Aziz M. Ahsan

[57] ABSTRACT

In aspect, the present invention is directed to a method of modifying a circuit board having at least one Ball Grid Array (BGA). The method includes removing the via portion of the BGA pad from the circuit board to sever the connection between the via and the circuit, attaching the pad connector to the circuit board, and connecting the pad connector to the circuit of the circuit board.

12 Claims, 9 Drawing Sheets

METHOD FOR MODIFYING CIRCUIT HAVING BALL GRID ARRAY INTERCONNECTIONS

This is a divisional of copending application Ser. No. 08/691,282 filed on Aug. 1, 1996 now pending.

BACKGROUND OF THE INVENTION

1. Field of the Invention

The present invention generally relates to circuit boards containing a Ball Grid Array module.

2. Problem to be Solved

Circuit boards containing a Ball Grid Array (BGA) module typically must undergo modifications or repair. For example, a circuit board may have an open internal net that should actually be connected to another net, a reference voltage, supply voltage, or ground potential. Furthermore, engineering changes might be necessary once the circuit is in its operating environment. Typically, such circuit boards are discarded and replaced with new boards fabricated to include the modification. What is needed is a method of repairing or modifying circuit boards containing a BGA module in a timely and cost effective manner that will allow continued use of the circuit board.

It is an object of the present invention to provide an apparatus that can be used to effect modifications or repairs of a circuit board containing a BGA module.

It is another object of the present invention to provide a method for modifying or repairing a circuit board containing a BGA module that is cost effective and not time consuming.

Still other objects and advantages of the present invention will in part be obvious and will in part be apparent from the specification.

SUMMARY OF THE INVENTION

The above and other objects and advantages, which will be apparent to one of skill in the art, are achieved in the present invention which is directed to, in a first aspect, a pad connector comprising a substantially flat pad portion, and a tail portion having a first end attached to the pad portion and a second end. The tail portion IS angulated with respect to the pad portion.

In a related aspect, the present invention is directed to a method of modifying a circuit board having at least one Ball Grid Array (BGA) pad comprising a pad portion, a trace portion attached to the pad portion and a via portion attached to the trace portion, the pad portion being attached to the surface of the circuit board, the via portion being disposed within an opening in the circuit board and conductively connected to a circuit in the circuit board, the method comprising the steps of:

a) removing the via portion of the BGA pad from the circuit board to sever the connection between the via portion and the circuit;

b) depositing epoxy into the opening previously occupied by the via portion of the BGA pad;

c) forming a bore extending through the epoxy;

d) removing the pad and trace portions of the BGA pad from the circuit board;

e) depositing epoxy on the portion of the circuit board previously occupied by the pad portion of the BGA pad;

f) providing a pad connector comprising a substantially flat pad portion, and a tail portion having a first end attached to the pad portion and a second end, the pad portion being angulated with respect to the tail portion;

g) attaching the pad connector to the circuit board by inserting the tail portion into the bore formed in the epoxy and positioning the pad portion of the pad connector in the epoxy deposited in step (e);

h) curing the epoxy deposited in step (e); and i) connecting the pad connector to the circuit of the circuit board.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

In describing the preferred embodiment of the present invention, reference will be made herein to FIGS. 1–7B of the drawings in which like numerals refer to like features of the invention.

Figure 1:
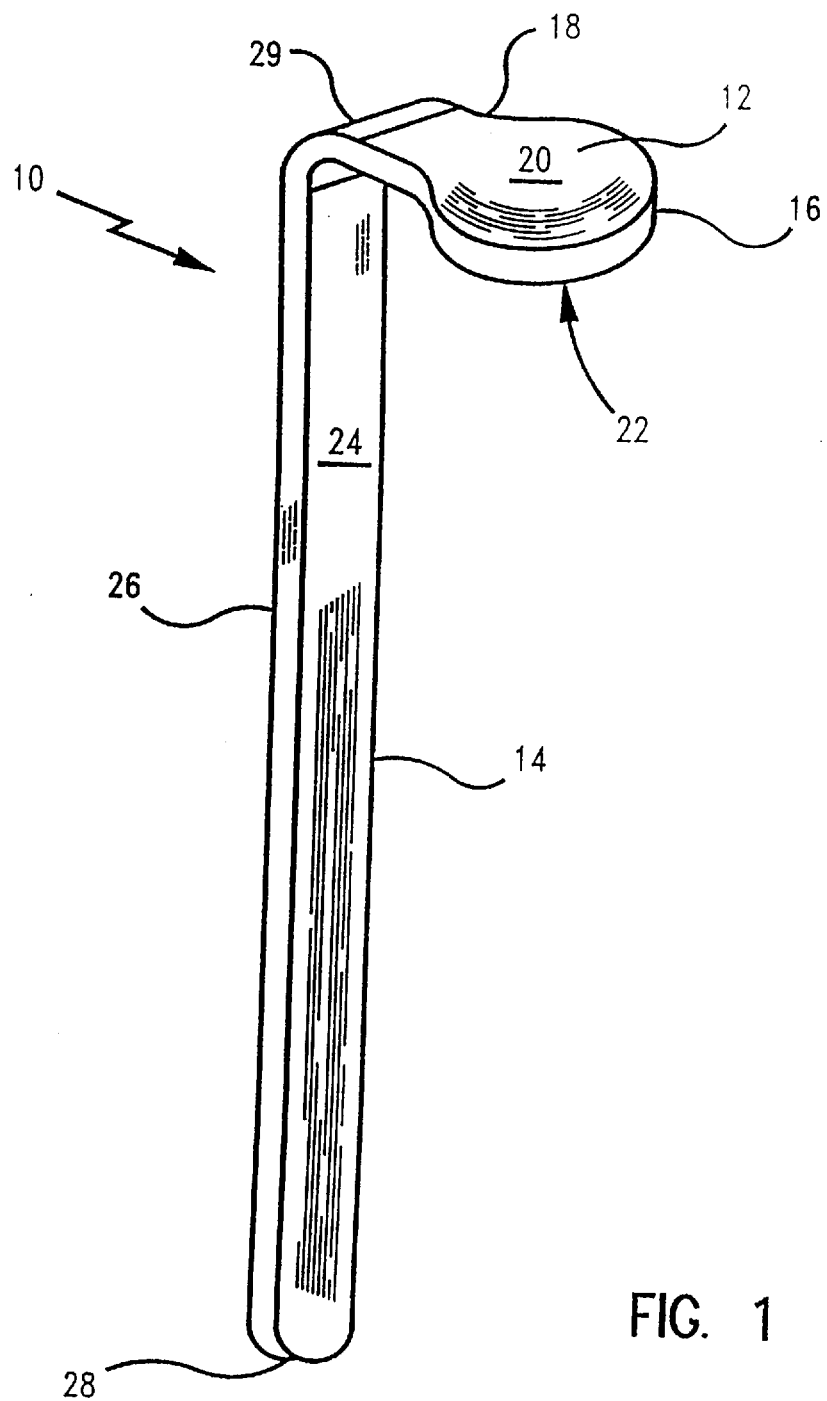
FIG. 1 is a perspective view of a pad connector of the present invention showing the front portion.
Figure 2:
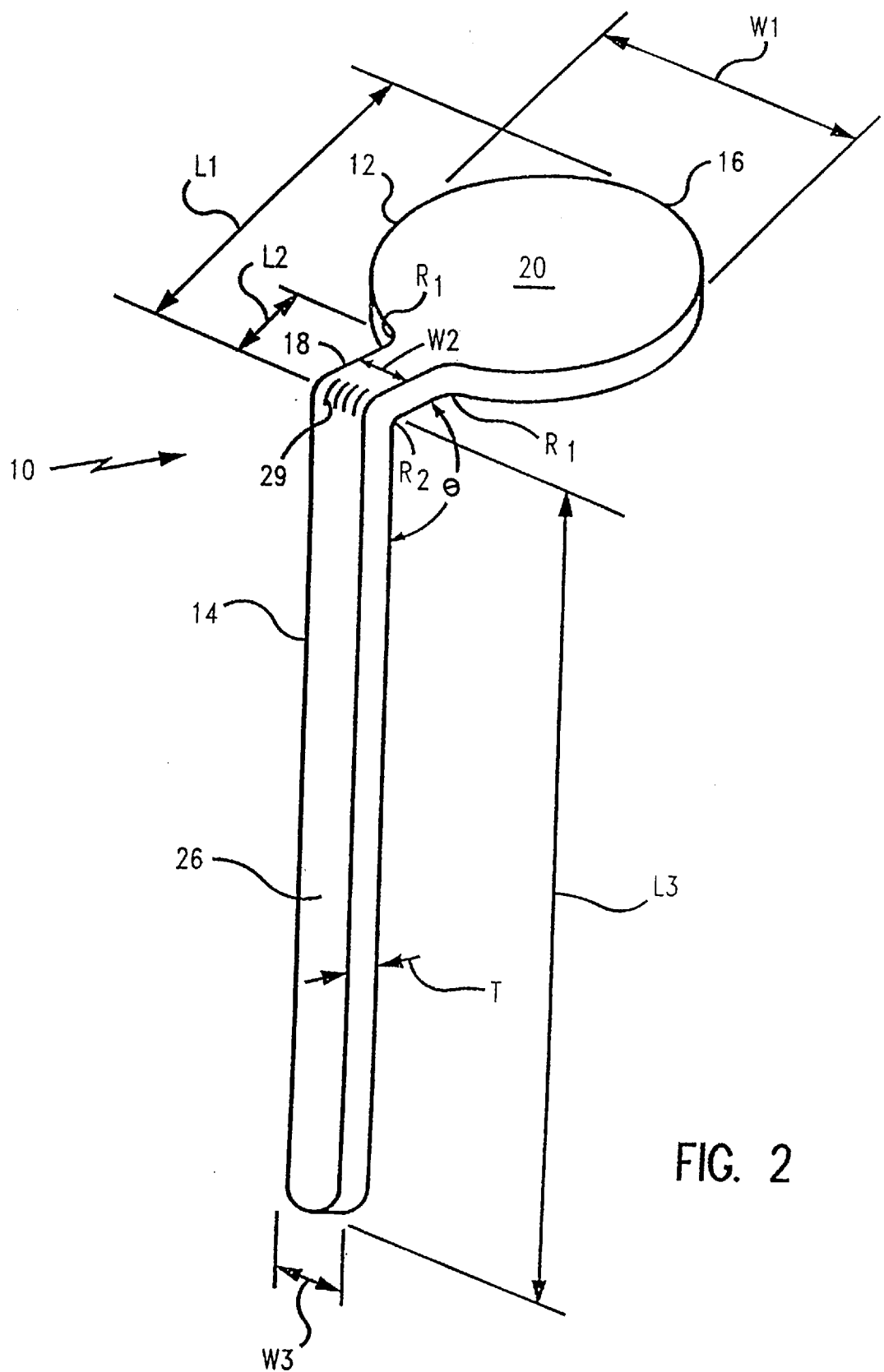
FIG. 2 is a perspective view of the pad connector of FIG. 1 showing the rear portion.

Referring to FIGS. 1 and 2, pad connector 10 of the present invention is shown. Pad connector 10 comprises a pad portion 12 and elongated tail portion 14. Pad portion 12 is substantially flat and is angulated with respect to tail section 14. Pad portion 12 comprises a substantially rounded portion 16, top surface 20, bottom surface 22 and narrow or neck portion 18. Rounded portion 16 is coplanar with neck portion 18. Tail portion 14 comprises inner surface 24, outer surface 26 and rounded bottom portion 28. Portion 29 of pad connector 10 is where neck portion 18 is attached to tail portion 14 and is substantially rounded and smooth. In a preferred embodiment, pad connector 10 is fabricated from copper and is coated with a layer of electroless tin. Preferably, the layer of electroless tin has a thickness of about 30 μinch. Other suitable materials may also be used to fabricate pad connector 10.

Referring to FIG. 2, pad connector 10 has a thickness T between about 0.004 and 0.005 inch. Pad portion 12 preferably has a length $L_1$ between about 0.033 and 0.037 inch. More preferably, length $L_1$ is about 0.035 inch. Portion 12 has a width $W_1$ that is preferably between about 0.026 and 0.030 inch. More preferably, $W_1$ is about 0.028 inch. The point of contiguity between rounded portion 16 and narrow or neck portion 18 is radiused by $R_1$ inch. Preferably, $R_1$ is about 0.010 inch. Neck portion 18 has a width $W_2$ that is preferably between about 0.012 and 0.016 inch. More preferably, $W_2$ is about 0.014 inch. Neck portion 18 is preferably angulated at an angle $\Theta$ that is between about 89° and 91° with respect to tail portion 14.

More preferably, $\Theta$ is about 90°. The point of angulation of neck portion 18 (portion 29 in FIG. 1) preferably has a radius $R_2$ of about 0.005 inch. Narrow or neck portion 18 preferably has a length $L_2$ between about 0.005 and 0.009 inch. More preferably, $L_2$ is about 0.007 inch. Tail section 14 has a length $L_3$ which depends upon the thickness of the circuit board to which pad connector will be attached. Preferably, length $L_3$ is slightly greater than the thickness of the circuit board such that tail portion protrudes or extends from the bottom of the circuit board. Tail portion 14 has a width $W_3$ that is preferably between about 0.012 and 0.016 inch. More preferably, $W_3$ is about 0.014 inch.

Figure 3A:
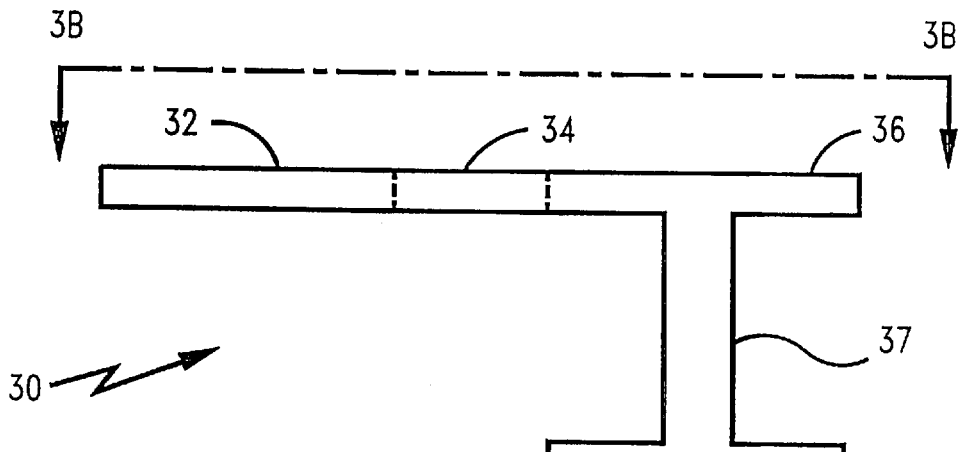
FIG. 3A is side elevational view of a conventional via-type pad connector.
Figure 3B:
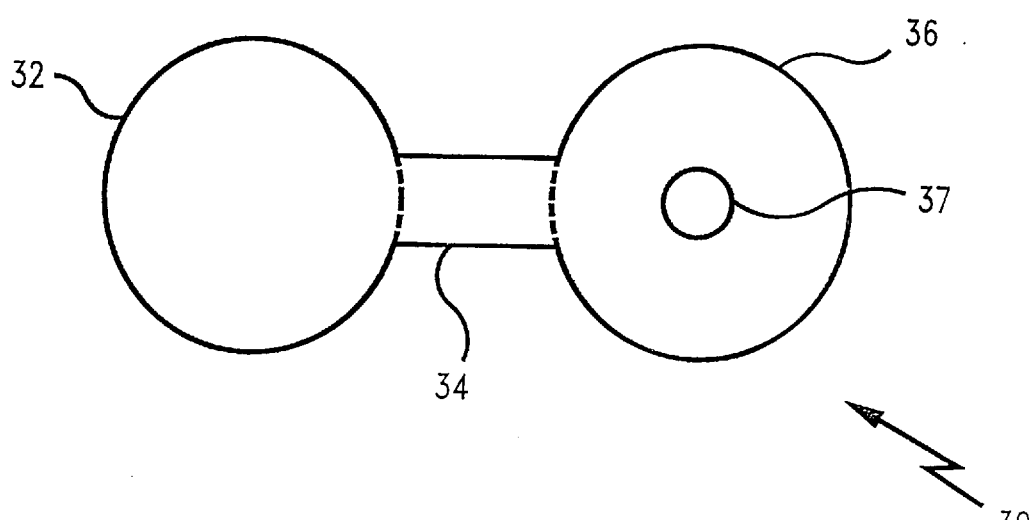
FIG. 3B is a view taken along line 3B—3B of FIG. 3A.
Figure 3C:
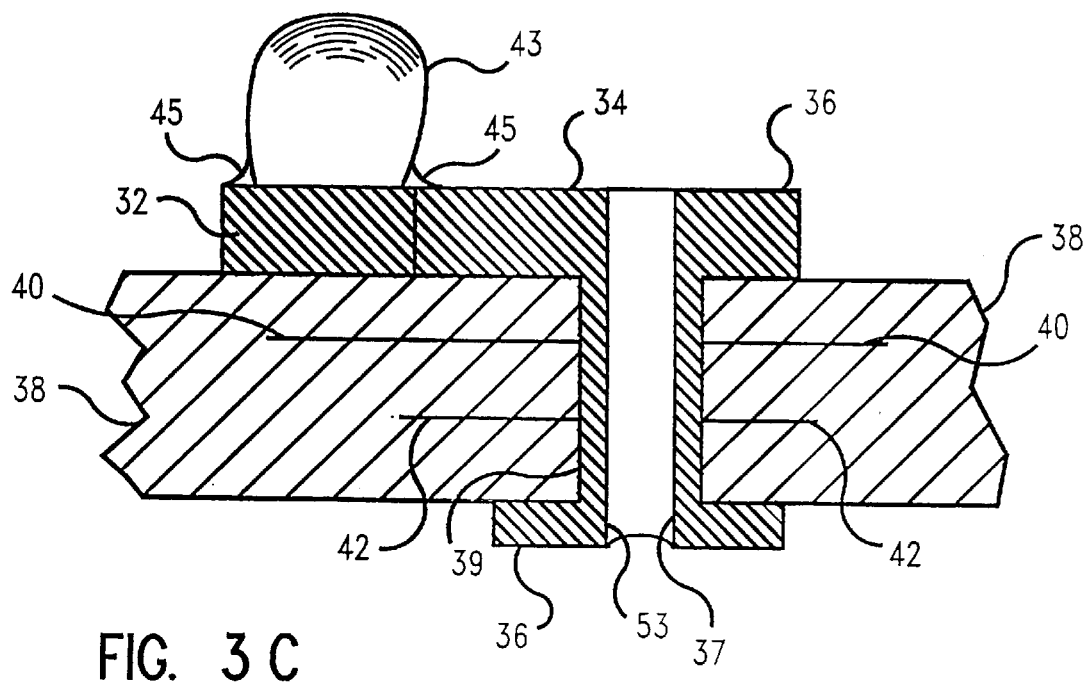
FIG. 3C is a partial, cross-sectional view of a circuit board having the via-type pad connector of FIG. 3A.
Figure 4A:
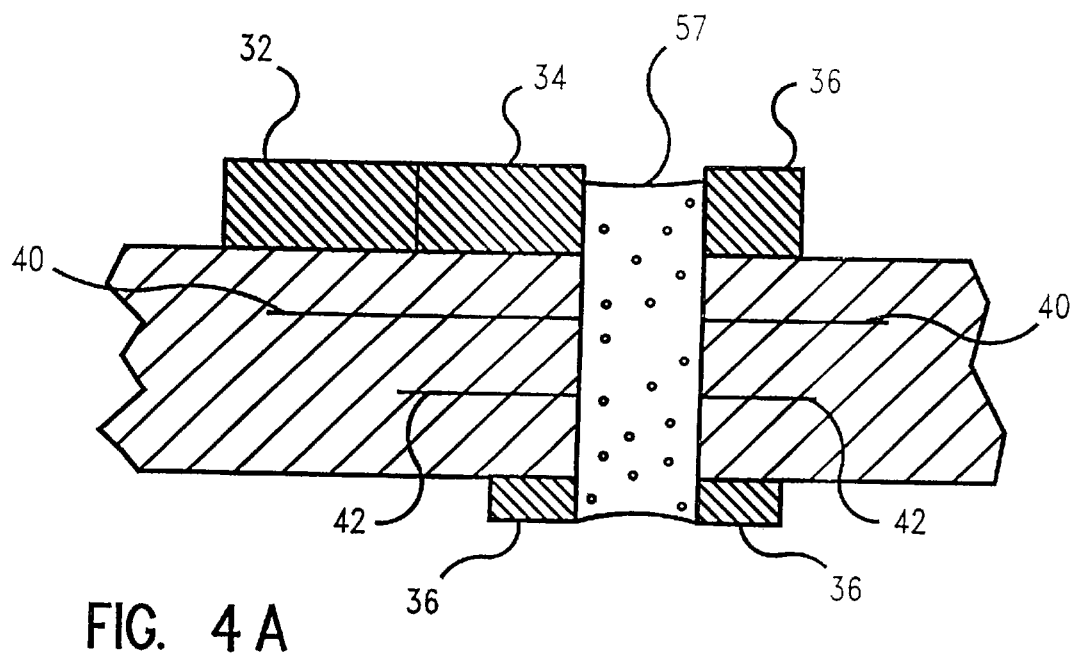
FIGS. 4A–4F are partial, cross-sectional views of the circuit board of FIG. 3C illustrating the method of the present invention.
Figure 4B:
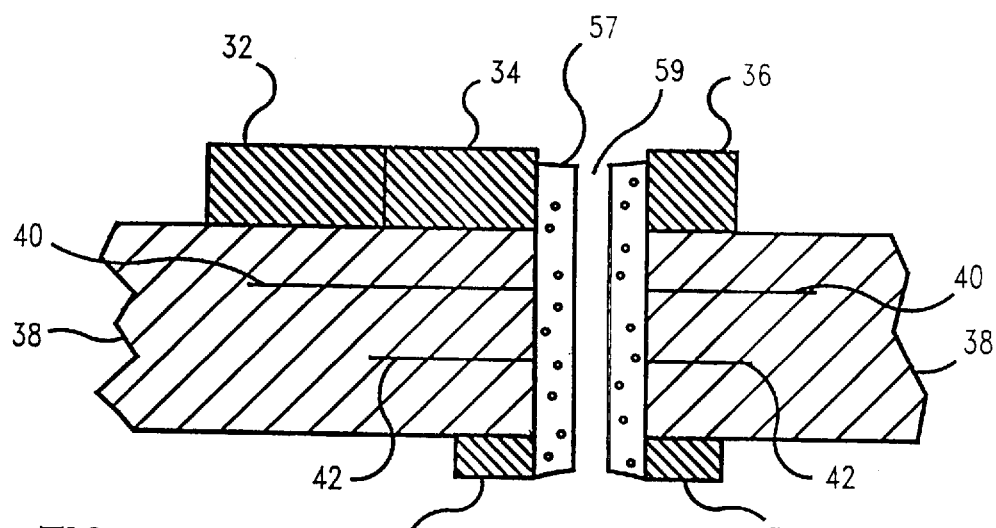
Figure 4C:
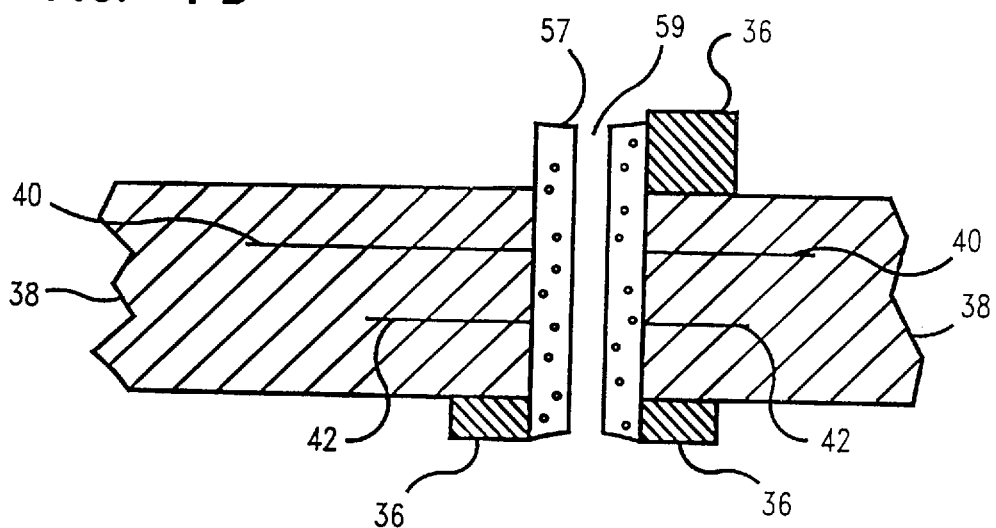
Figure 4D:
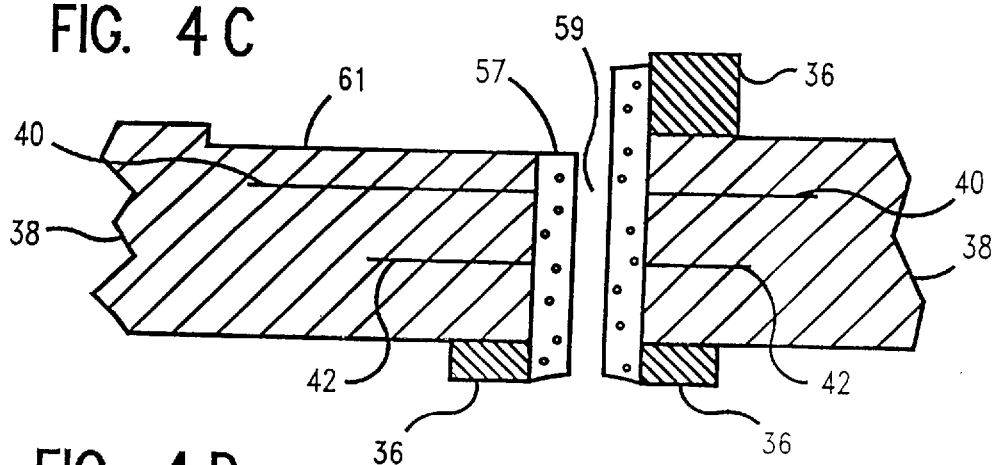
Figure 4E:
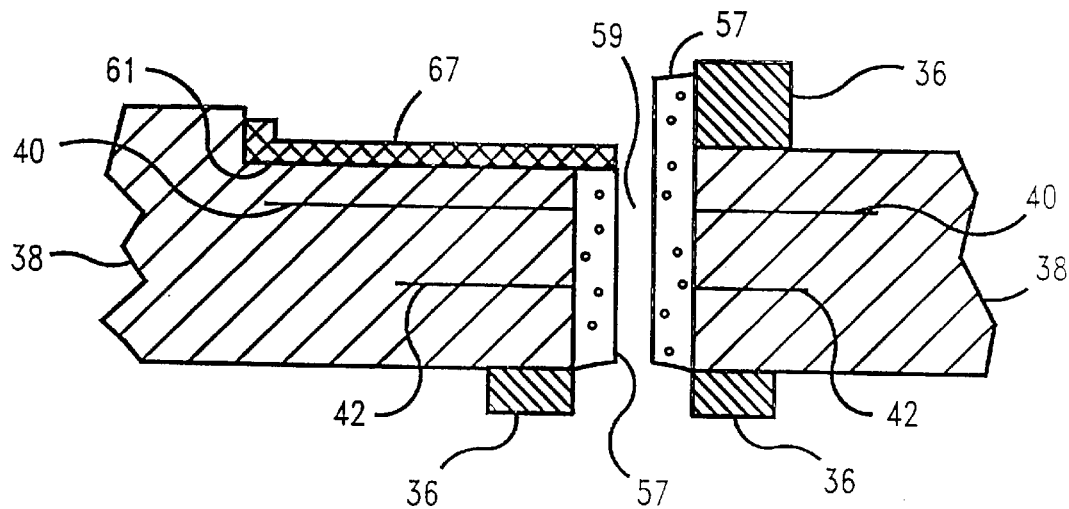
Figure 4F:
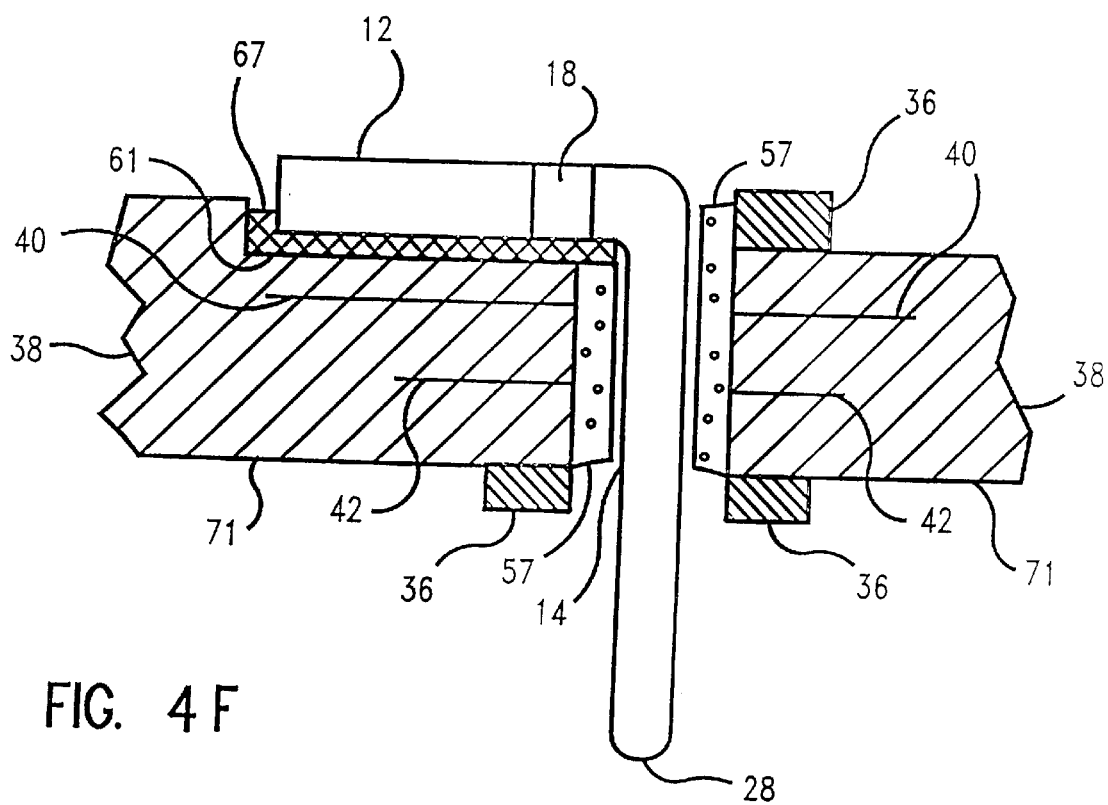

Referring to FIGS. 3A and 3B, a conventional via-type pad 30 is shown. Pad 30 comprises pad portion 32, trace portion 34, and via support portion 36 having via 37 attached thereto. FIG. 4A shows pad 30 mounted to circuit board 38. Internal circuits 40 and 42 are conductively coupled to via portion 37 which is disposed in bore 39 in circuit board 38. Solder ball 43 of a BGA (not shown) is attached to pad portion 32 via solder joints 45. In order to effect a modification or engineering change (EC) to the site on circuit board 38 where pad 30 is conductively coupled to a BGA module via solder ball 43, the method of the present invention shown in FIGS. 7A and 7B is implemented.

Figure 5:
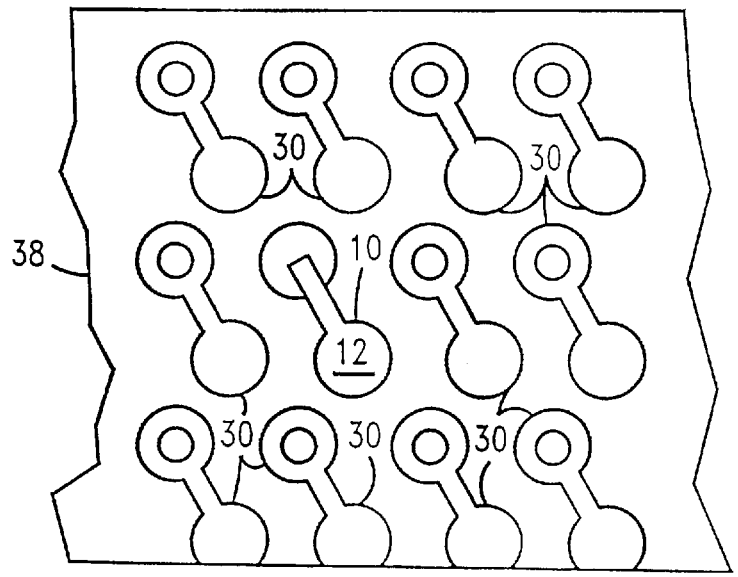
FIG. 5 is a top plan view of the circuit board of FIG. 3C having attached thereto the pad connector of the present invention.
Figure 6:
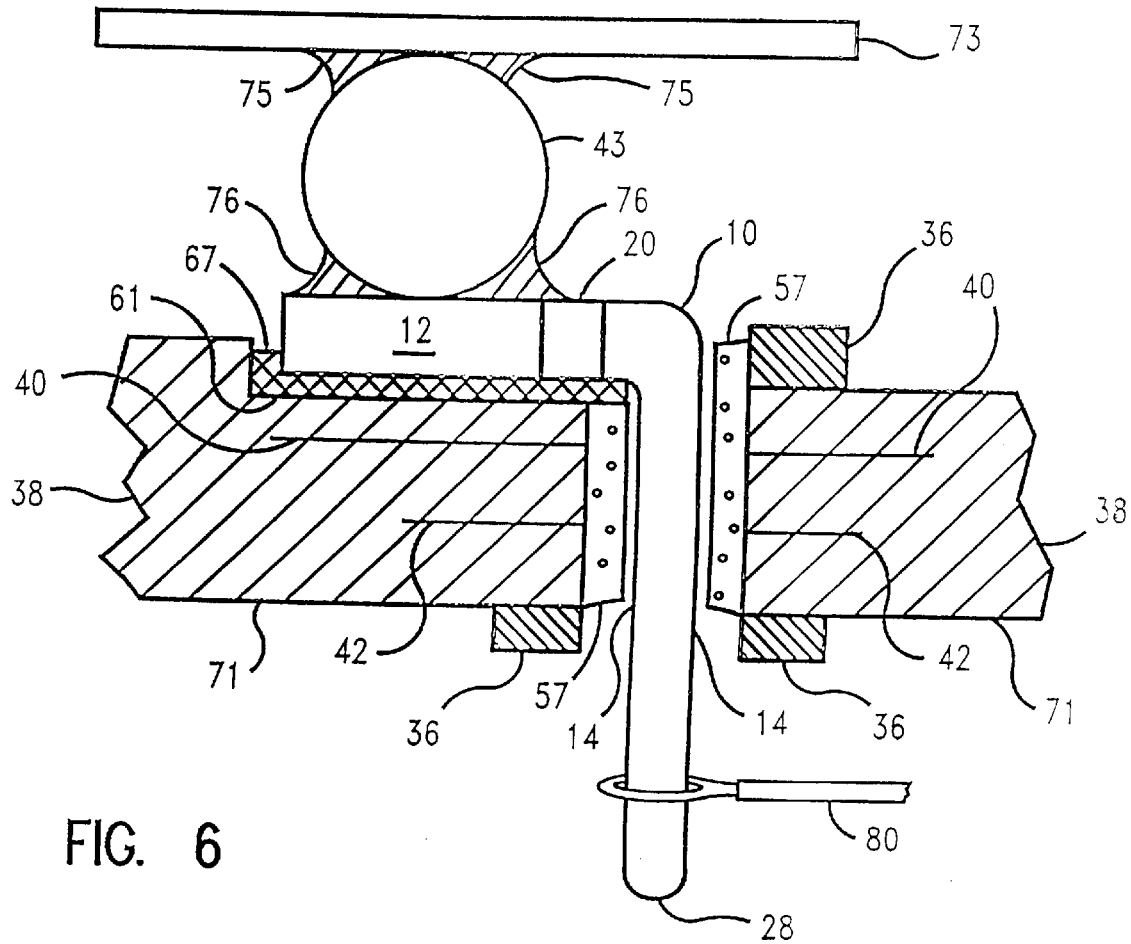
FIG. 6 is a partial view, partially in cross-section, of the circuit board having the pad connector of the present invention attached thereto and conductively coupled to a solder ball of a Ball Grid Array.
Figure 7A:
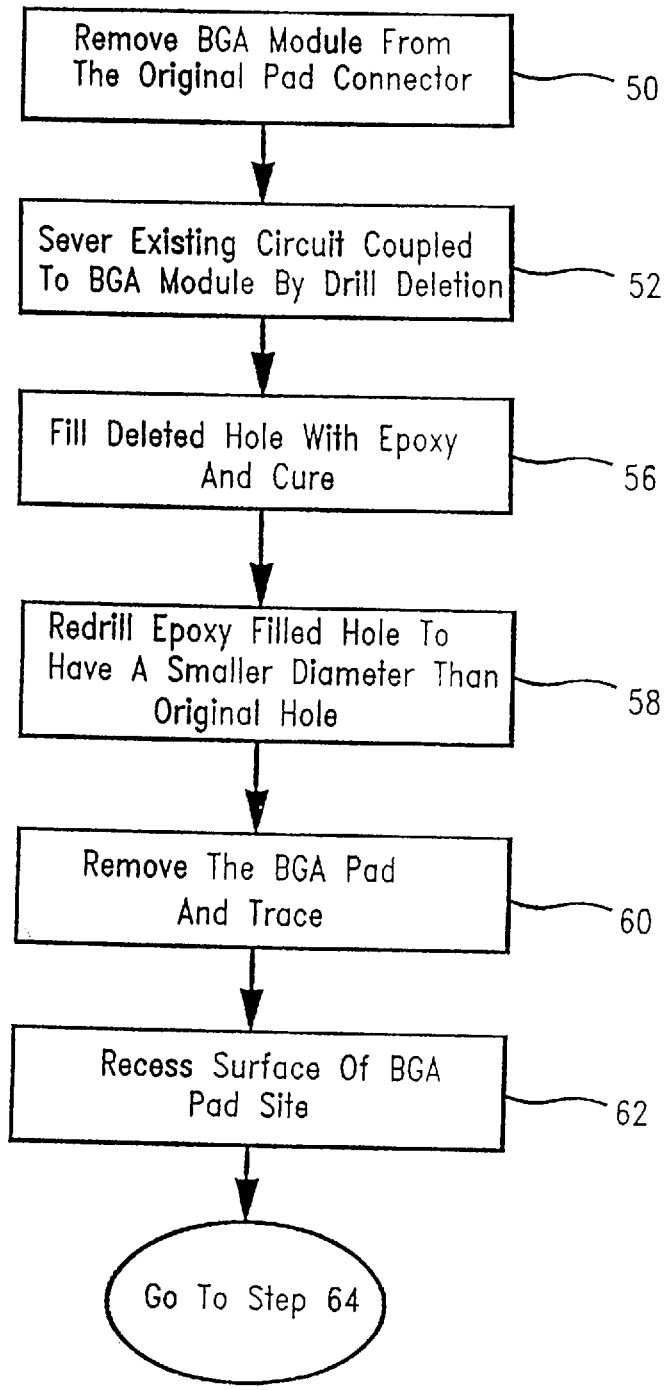
FIGS. 7A and 7B are flow diagrams illustrating the method of the present invention.
Figure 7B:
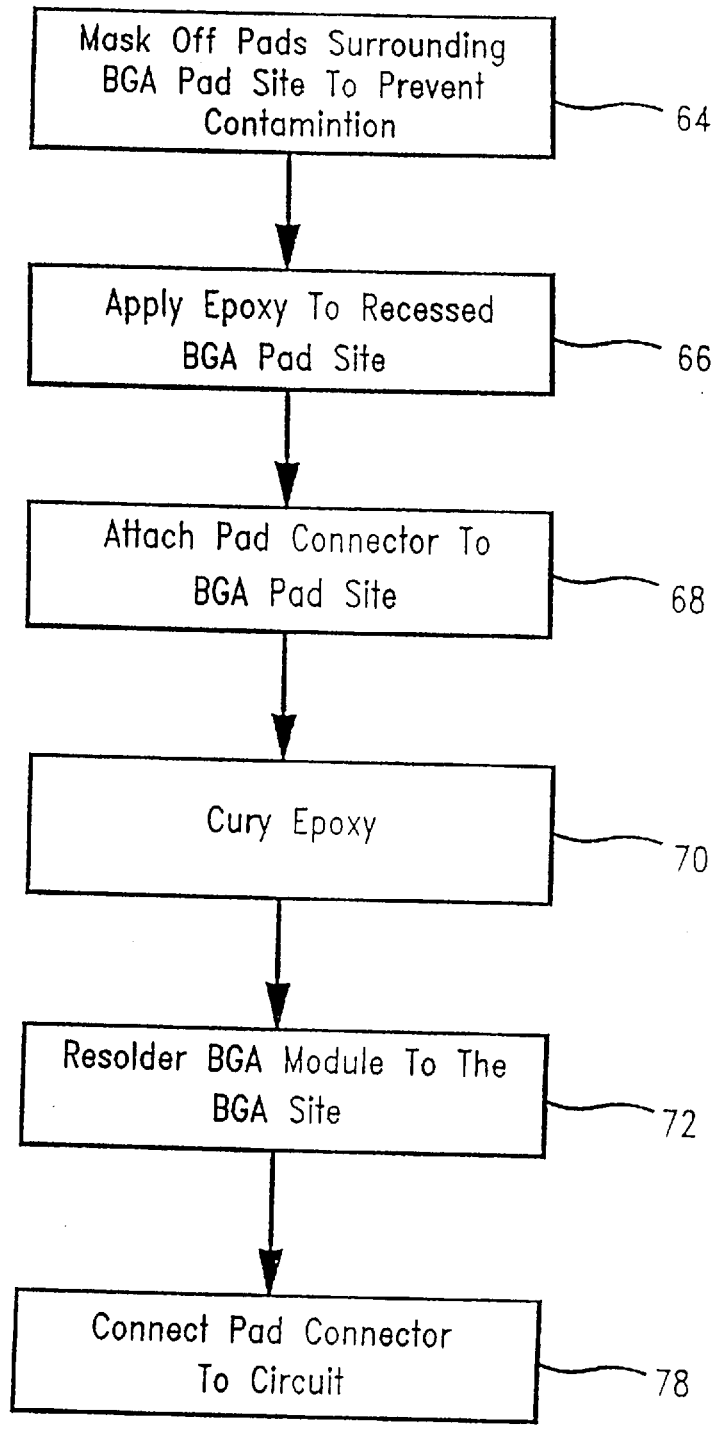

In order to facilitate understanding of the method of the present invention, FIGS. 7A and 7B should be referred to in conjunction with FIGS. 3C and 4A–6. The method of the present invention starts at step 50 which entails removing the BGA module from original pad connector 30. This is accomplished by removing solder ball 43 from pad portion 32 of pad 30. Step 52 effects severing the existing circuits or nets 40 and 42 that are conductively coupled to via portion 37. This is accomplished by drill deleting via 37 (see FIG. 4A). After the initial drilling, a layer of copper from via 37 remains on inside wall 54 of bore 39 circuit board 38. A larger sized bit is then used to remove this residual copper layer. Next, step 56, entails filling the bore 39, from which via 37 was deleted, with epoxy 57 and curing the epoxy (see FIG. 4A). In step 58, a new bore 59 is formed in epoxy 57. This bore has a diameter that is smaller than the circuit board opening that receives via 37. This is accomplished by drilling through epoxy 57 (see FIG. 4B). Next, step 60 effects the removal of pad portion 32 and trace 34 of via-type pad 30 (see FIG. 4C). This can be accomplished by using a router.

Next, step 62 entails forming recess 61 on the surface of circuit board 38 previously occupied by pad portion 32 of pad 30. Any protruding epoxy 57 (see FIG. 4D) is made coplanar with recess 61 so as to provide a substantially coplanar surface for receiving pad portion 12 of pad connector 10 of the present invention. Step 62 also can be accomplished with a router or similar device. In step 64, BGA pads surrounding the site previously occupied by pad 30 are masked off to prevent contamination. Next, step 66 entails applying a small amount of epoxy 67 to the recessed BGA site (see FIG. 4E). The mask covering the surrounding pads prevent smear contamination of those pads.

In step 68, pad connector 10 of the present invention is attached to circuit board 38. This is accomplished by inserting tail section 14 of pad connector 10 into bore 59 and positioning pad portion 12 into the epoxy covered recess 61 (see FIG. 4F). Pad connector 10 is preferably positioned such that tail portion 14 is spaced from epoxy 57. The bottom portion of tail portion 14 extends from bottom side 71 of circuit board 38. FIG. 5 shows a top plan view of circuit board 38 with pad connector 10 mounted thereto and surrounded by conventional via-type pads 30. In step 70, epoxy 67 applied to the recess 61 is allowed to cure.

Referring to FIG. 6, BGA module 73 includes solder ball 43, previously described above, which is attached to module 73 by solder joints 75. Solder ball 43 is attached to top surface 20 of pad portion 12 solder joints 76. In step 78, pad connector 10 is conductively coupled to the appropriate circuits in circuit board 38. Referring again to FIG. 6, pad connector 10 is conductively coupled to the appropriate circuit via wire 80 which is external to circuit board 38. Depending on the type of wires used, e.g. coax, twisted pairs, etc., a ground bus is preferably located on bottom side 71 of circuit board 38. The ground wire on the coax or twisted pair must be coupled to a ground pad close to signal termination. If a single wire is used to conductively couple pad connector 10 to the appropriate circuit, then no ground pad is necessary.

Thus, the present invention provides a pad connector and a method for using the pad connector to effect repairs or modification to circuits containing a BGA module. The repair or modifications can be implemented in a timely and cost effective manner. Therefore, such circuits can now be reused and not discarded thereby reducing production and manufacturing costs and improving production yield.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of modifying a circuit board having at least one Ball Grid Array (BGA) pad comprising a pad portion, a trace portion attached to the pad portion and a via portion attached to the trace portion, the pad portion being attached to the surface of the circuit board, the via portion being disposed within an opening in the circuit board and conductively connected to a circuit in the circuit board, the method comprising the steps of:

a) removing the via portion of the BGA pad from the circuit board to sever the connection between the via portion and the circuit;

b) depositing epoxy into the opening previously occupied by the via portion of the BGA pad;

c) forming a bore extending through the epoxy;

d) removing the pad and trace portions of the BGA pad from the circuit board;

e) depositing epoxy on the portion of the circuit board previously occupied by the pad portion of the BGA pad;

f) providing a pad connector comprising a substantially flat pad portion, and a tail portion having a first end attached to the pad portion and a second end, the pad portion being angulated with respect to the tail portion;

g) attaching the pad connector to the circuit board by inserting the tail portion into the bore formed in the epoxy and positioning the pad portion of the pad connector in the epoxy deposited in step (e);

h) curing the epoxy deposited in step (e); and i) connecting the pad connector to the circuit of the circuit board.

2. The method as set forth in step 1 wherein the removing step (a) comprises drill deleting the via portion from the circuit board opening.

3. The method as set forth in step 1 further including the step of curing the epoxy deposited in step (b).

4. The method as set forth in step 1 wherein the forming step (c) comprises drilling the bore through the epoxy.

5. The method as set forth in step 1 wherein the diameter of the bore is less than the diameter of the circuit board opening.

6. The method as set forth in claim 1 further comprising the step of, after step (e), forming a recess in the portion of the circuit board previously occupied by the pad portion of the BGA pad.

7. The method as set forth in claim 6 wherein in the applying step (e), epoxy is deposited in the recess formed in the circuit board.

8. The method as set forth in claim 7 wherein the circuit comprises a plurality of BGA pads surrounding the BGA pad being removed in step (a), the method further comprising the step of masking the BGA pads surrounding the recess prior to depositing the epoxy in the recess.

9. The method as set forth in claim 1 wherein the removing step (a) includes the step of removing the BGA module from the BGA pad prior to removing the BGA pad.

10. The method as set forth in claim 9 further comprising the step of, after the curing step (h), soldering the BGA module to the pad portion of the pad connector.

11. The method as set forth in claim 1 wherein in the connecting step (h), the tail portion of the pad connector is connected to the circuit of the circuit board.

12. The method as set forth in claim 11 wherein the connecting step comprises the steps of:

providing a wire; and conductively connecting the wire between the tail portion of the pad connector and the circuit of the circuit board.

* * * * *